United States Patent
Schilling et al.

(10) Patent No.: US 9,997,654 B2
(45) Date of Patent: Jun. 12, 2018

(54) SOLAR CELL RECEIVER

(75) Inventors: Roland Schilling, Gemmingen (DE); Victor Khorenko, Neuenstadt a.K. (DE)

(73) Assignee: Azur Space Solar Power GmbH, Heilbronn (DE)

( * ) Notice: Subject to any disclaimer, the term of this patent is extended or adjusted under 35 U.S.C. 154(b) by 178 days.

(21) Appl. No.: 13/982,665

(22) PCT Filed: Jan. 31, 2012

(86) PCT No.: PCT/EP2012/000704
§ 371 (c)(1),
(2), (4) Date: Oct. 15, 2013

(87) PCT Pub. No.: WO2012/104107
PCT Pub. Date: Aug. 9, 2012

(65) Prior Publication Data
US 2014/0026959 A1     Jan. 30, 2014

(51) Int. Cl.
*H01L 31/0232* (2014.01)
*H02S 40/22* (2014.01)
(Continued)

(52) U.S. Cl.
CPC ...... *H01L 31/02327* (2013.01); *H01L 31/048* (2013.01); *H01L 31/0543* (2014.12);
(Continued)

(58) Field of Classification Search
CPC ............... H01L 31/048; H01L 31/0488; H01L 31/0232; H01L 31/02327; H01L 31/054;
(Continued)

(56) References Cited

U.S. PATENT DOCUMENTS 4,224,081 A * 9/1980 Kawamura ....... B32B 17/10761
136/251
5,167,724 A    12/1992 Chiang
(Continued)

FOREIGN PATENT DOCUMENTS

CN       1960016 A    5/2007
CN    101313415 A   11/2008
(Continued)

OTHER PUBLICATIONS

Machine translation of CN 101436619; accessed and printed Aug. 24, 2015.*
(Continued)

*Primary Examiner* — Edward J. Schmiedel
(74) *Attorney, Agent, or Firm* — Muncy, Geissler, Olds & Lowe, P.C.

(57) ABSTRACT

A solar cell receiver is provided that includes a semiconductor element that has a front face, a solar cell provided on the front face, a rear face, multiple lateral surfaces and two electric connectors; a carrier for receiving the semiconductor element, the rear face of the element being fixed to the carrier; and an optical element for concentrating the light onto the rear face of the semiconductor element. The optical element has an underside which partially faces the upper side of the semiconductor element, the underside of the optical element has a first shaped section with a first surface that lies on the front face of the semiconductor element and a second surface that lies on the carrier. The shaped section is designed as a cavity or groove.

12 Claims, 2 Drawing Sheets

(51) Int. Cl.
*H01L 31/048* (2014.01)
*H01L 31/054* (2014.01)
*H02S 40/20* (2014.01)

(52) U.S. Cl.
CPC .......... *H01L 31/0547* (2014.12); *H02S 40/22* (2014.12); *H02S 40/20* (2014.12); *Y02E 10/52* (2013.01)

(58) Field of Classification Search
CPC . H01L 31/0543; H01L 31/0547; H02S 30/00; H02S 30/10; H02S 40/20; H02S 40/22
See application file for complete search history.

(56) References Cited

U.S. PATENT DOCUMENTS

| | | |
|---|---|---|
| 7,560,748 B2 | 7/2009 | Ishizaka et al. |
| 2007/0070531 A1 | 3/2007 | Lu |
| 2007/0102722 A1* | 5/2007 | Ishizaka ............ H01L 33/641 257/99 |
| 2007/0215197 A1* | 9/2007 | Buller .............. H01L 31/0203 136/243 |
| 2007/0289622 A1* | 12/2007 | Hecht ............... H01L 31/055 136/246 |
| 2009/0095967 A1 | 4/2009 | Masui et al. |
| 2010/0018568 A1* | 1/2010 | Nakata ............. H01L 31/03528 136/246 |
| 2010/0018570 A1* | 1/2010 | Cashion ............. F24J 2/5424 136/246 |
| 2010/0139767 A1* | 6/2010 | Hsieh ............... H01L 23/3672 136/259 |
| 2010/0263705 A1* | 10/2010 | Ide .................. H01L 31/1804 136/244 |
| 2010/0283069 A1* | 11/2010 | Rogers ............... H01L 31/0725 257/98 |
| 2011/0017295 A1 | 1/2011 | Yu et al. |
| 2012/0187439 A1 | 7/2012 | Bosch et al. |

FOREIGN PATENT DOCUMENTS

| | | |
|---|---|---|
| CN | 101 436 619 A | 5/2009 |
| EP | 1 953 825 A2 | 8/2008 |
| EP | 1 953 835 A1 | 8/2008 |
| EP | 2 073 279 A1 | 6/2009 |
| EP | 2 194 584 A1 | 6/2010 |
| EP | 2 278 630 A1 | 1/2011 |
| EP | 2 278 631 A1 | 1/2011 |

OTHER PUBLICATIONS

Definition of flush by the free Dictionary; http://www.thefreedictionary.com/flush; accessed and printed Mar. 4, 2017.*

* cited by examiner

SOLAR CELL RECEIVER

This nonprovisional application is a national stage of International Application No. PCT/EP2012/000704, which was filed on Jan. 31, 2012, and which claims priority to European Patent Application No. 11000736.6, which was filed in Europe on Jan. 31, 2011, and which are both herein incorporated by reference.

BACKGROUND OF THE INVENTION

Field of the Invention

The invention relates to a solar cell receiver.

Description of the Background Art

EP 2 073 279 A1 discloses a solar cell receiver in which a semiconductor body configured as a solar cell is placed on a substrate. To protect the semiconductor body and particularly the lateral surfaces thereof from environmental effects, which cause degradation of the electrical parameters, a frame is placed around the semiconductor body on three sides and closed with a transparent cover. Next, the remaining gap is filled with a transparent potting compound and an optical element is attached.

EP 1 953 825 A2 discloses a housing in which a semiconductor body formed as an LED is placed on a substrate. Next, to protect the semiconductor body a sealing film and a housing consisting of multiple parts, which also comprises an optical element, is mounted in a multistep process on the substrate.

US 2011 0172 95 A1 discloses a solar cell with an optical element. The optical element concentrates the incident light on the solar cell and is simultaneously the potting compound for the solar cell. The potting compound surrounds the semiconductor layers of the solar cell almost completely. Furthermore, EP 2 278 631 A1 discloses a further design of a solar cell with an optical element. A plurality of housing designs having an optical element and an LED are known from US 2007 102 722 A1, EP 1 953 835 A1, EP 2 073 279 A1, and EP 2 194 584 A1.

SUMMARY OF THE INVENTION

It is therefore an object of the present invention to provide a device that refines the prior art.

According to the subject matter of the invention, a solar cell receiver with a semiconductor body is disclosed, having a front face with a solar cell formed on the front face, a rear face, multiple lateral surfaces, and two electrical connectors, and a substrate for receiving the semiconductor body, whereby the rear face of the semiconductor body is fixed to the substrate, and an optical element for concentrating light on the front face of the semiconductor body, said element having an underside, which partially faces the upper side of the semiconductor body, whereby the optical element on the underside has a first shaped section with a first surface, which lies on the front face of the semiconductor body, and has a second surface, which lies on the substrate, and the shaped section is formed as a cavity or as a groove.

An advantage of the device of the invention is that the optical element, which is preferably configured as a concentrator, has a shaped section matching the shape and size of the semiconductor body and by sinking the optical element on the substrate reliably protects the semiconductor body, configured as a solar cell, and particularly the lateral edges of the semiconductor body from environmental effects. Because the optical element at the same time is the housing as well, a cost-effective solution is created for producing extremely robust solar cell receivers. The number of the production steps for producing the solar cell module is reduced.

Tests by the applicant have shown that different shapes of optical elements can be formed as a housing, which on all sides surround the semiconductor body parts protruding from the substrate. It is preferred in this case to configure the particular forms of the optical element as a single piece. Preferred forms of optical elements are, inter alia, a lens-shaped or funnel-shaped or pyramidal/frustum-shaped design. A common feature of the different forms of the optical element is that on the underside each form has a circumferential edge area, which is substantially flush form-fittingly with the surface of the substrate. It is preferred that the cavity or the groove of the first shaped section of the optical element is configured completely circumferential around the lateral surfaces of the semiconductor body. In the embodiment with a groove on the underside of the optical element, only the outer edge region on the front face of the semiconductor body is covered by a part of the groove of the optical element. It is preferred in the outer edge region of the semiconductor body, which is covered by the groove, to arrange a sealing layer, which is configured preferably as a transparent adhesive layer, between the optical element and the front face of the semiconductor body.

In a refinement, the first shaped section together with the lateral surfaces of the semiconductor body forms a gap. It is preferred to fill the gap with a transparent potting compound. In an alternative embodiment, a sealing agent is provided between the lateral surfaces and the first shaped section. Preferably, the potting compound can be made as a transparent sealing agent.

In a further embodiment, an adhesive layer, which is preferably configured as a transparent layer, is preferably arranged between the second surface and the substrate. The optical element can be fixed by this means. Furthermore, the adhesive layer forms a sealing surface between the optical element and substrate, so that the semiconductor body is sealed hermetically from the environment. In a further refinement, in addition or alternatively, a potting compound, which is preferably formed as a transparent potting compound, is arranged between the first surface and the front face of the semiconductor body.

According to a refinement, the optical element has a second shaped section formed as a cavity. It is preferred that the optical element in the second shaped section receives a part of a bypass diode, said part formed from the surface of the substrate. In this case, the bypass diode is spaced apart from the semiconductor body. In an alternative embodiment, it is preferable that the second shaped section has a connection with the first shaped section in such a way that only a single shaped section is formed which receives both components. As a result, after the optical element is mounted, a common gap, preferably filled with a potting compound, forms between at least one lateral surface of the solar cell and at least one lateral surface of the bypass diode.

In a preferred embodiment, the optical element is configured as a secondary optical element and concentrates an already focused light beam. By means of the multi-stage concentration, concentration factors above 50, preferably above 100, and most preferably above 300 are achieved. Because a high concentration factor above 50 is already achieved by means of the first concentration by primary optics, not discussed in greater detail here, which are generally formed as a Fresnel lens, the thus concentrated light stikes the optical element.

Tests have shown that the energy of the concentrated light is too high for an organically formed transparent optical element. The organic element is irreversibly damaged rapidly and becomes cloudy because of the high temperatures. According to a refinement, the optical element consists of an inorganic material. In particular, the optical element is made transparent to ultraviolet light. Preferably, the optical element is produced from a quartz glass composition. Quartz glass is both transparent to UV light and especially heat-resistant and aging-resistant. Furthermore, quartz glass is very recyclable.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will be described in greater detail below with reference to the drawings. In this respect, similar parts are labeled with identical designations. The illustrated embodiments are highly schematized; i.e., the distances and lateral and vertical extension are not to scale and, if not otherwise indicated, also do not have any derivable geometric relation to one another. Shown are.

DETAILED DESCRIPTION

Figure 1:
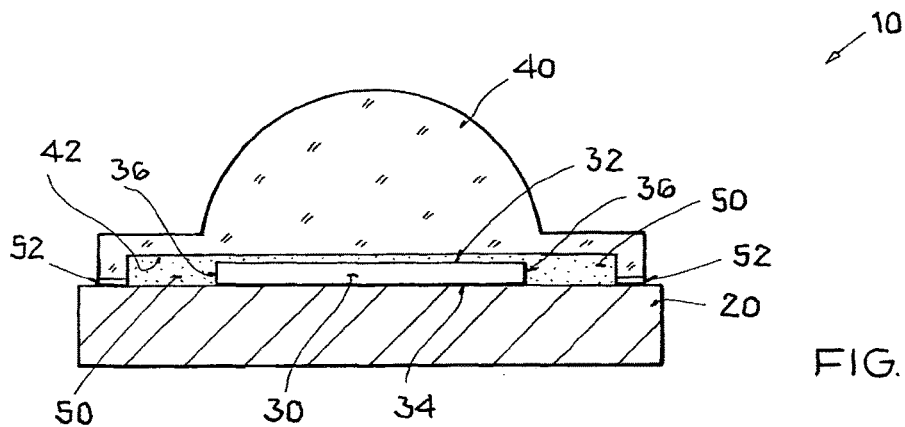
FIG. 1 is a schematic cross section of an embodiment of the invention of a solar cell receiver with an optical element.

The illustration of FIG. 1 shows a schematic cross section of a solar cell receiver 10 of the invention, having a substrate 20, a semiconductor body 30 formed as a solar cell and having a front face 32, a rear face 34, and multiple lateral surfaces 36. Rear face 34 of semiconductor body 30 is fixed to substrate 20. A lens-shaped optical element 40, which forms an underside with a cavity 42 for receiving semiconductor body 30, is formed above front face 32. A first surface of optical element 40 is formed above front face 32 of semiconductor body 30. Optical element 40 lies with a second surface on substrate 20. Cavity 42 is made larger than semiconductor body 30. The space between optical element 40 and semiconductor body 30 is filled with a preferably transparent potting compound 50. Further, an adhesive layer 52 is formed between the second surface and substrate 20. Furthermore, semiconductor body 30 has at least two electrical connectors preferably on the front face, which are not shown. It should be noted that optical element 40 is preferably made as a single piece and apart from the function of concentrating incident light on the front face of semiconductor body 30, has a sealing property particularly in conjunction with potting compound 50 and adhesive layer 52; i.e., it protects semiconductor body 30 from environmental influences. The concentration of light is achieved by means of the lens-shaped design of optical element 40.

Figure 2:
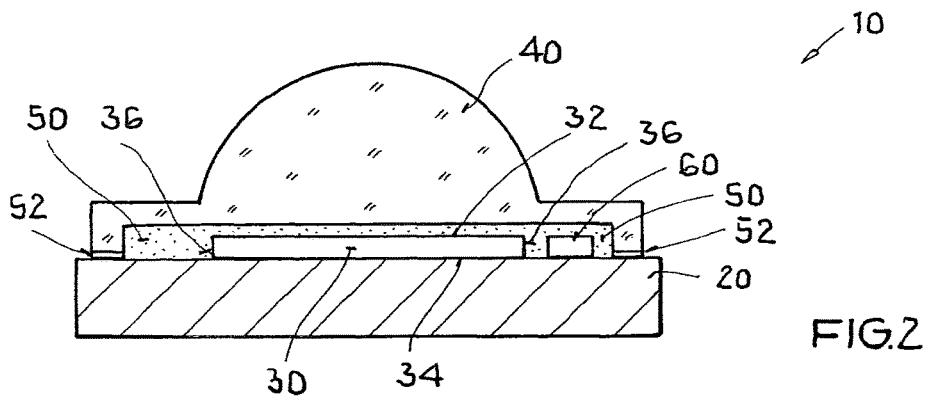
FIG. 2 is a schematic cross section of a solar cell receiver with an optical element and a bypass diode.

Another embodiment of solar cell receiver 10 is shown in the illustration of FIG. 2. Only the differences in regard to the embodiment of FIG. 1 will be explained below. A bypass diode 60 is arranged spaced apart on substrate 20. Bypass diode 60 is connected to the solar cell, which is not shown. The size of cavity 42 comprises bypass diode 60.

The space between optical element 40 and bypass diode 60 is filled with potting compound 50. As a result, bypass diode 60 is protected from environmental effects both by optical element 40 and by potting compound 50 in conjunction with adhesive layer 52.

Figure 3:
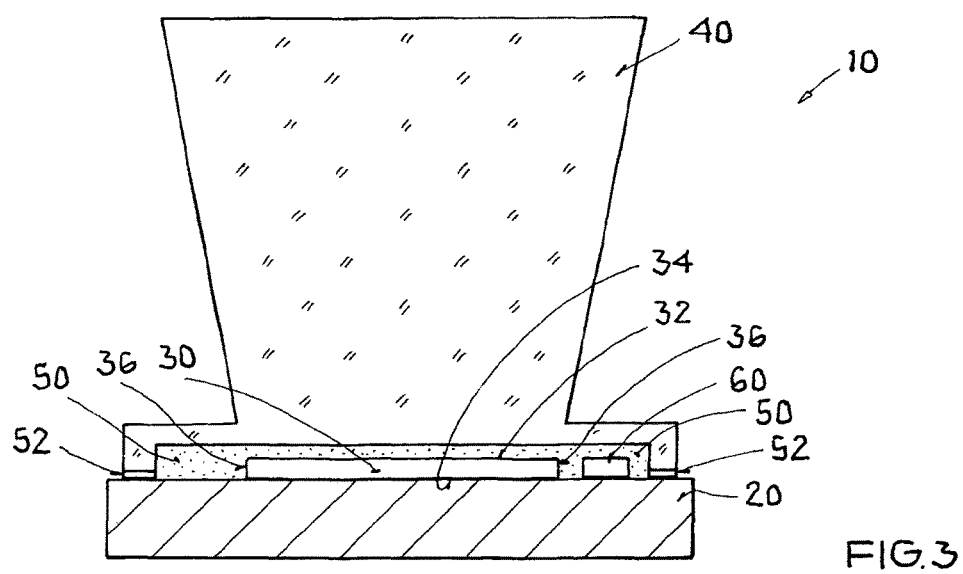
FIG. 3 is a schematic cross section of a solar cell receiver with a pyramid-shaped optical element with a bypass diode.

A schematic cross section of a solar cell receiver, in which optical element 40 has a pyramidal/frustum-shaped form, is shown in FIG. 3. Cavity 42 on the underside comprises both the solar cell and bypass diode 60. The light striking optical element 40 is preferably conducted by means of total reflection to front face 32 of semiconductor body 30.

Figure 4:
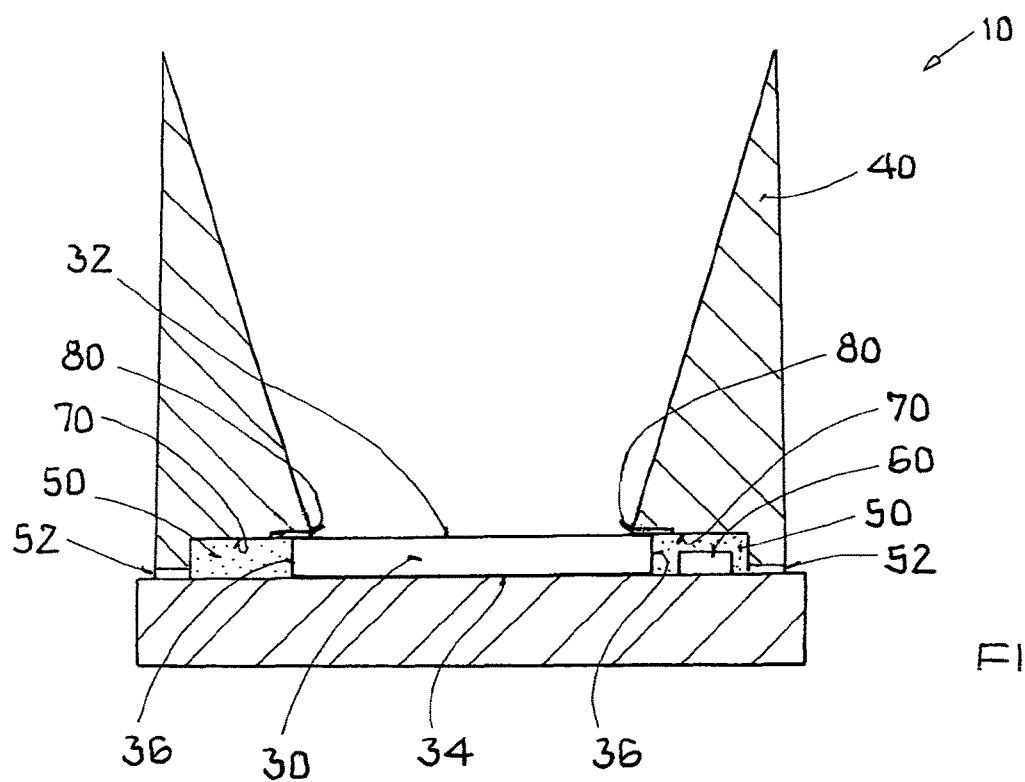
FIG. 4 is a schematic cross section of a solar cell receiver with a funnel-shaped optical element with a bypass diode.

A funnel-shaped design of optical element 40 is illustrated in FIG. 4 in a schematic cross section. On the inside of the funnel, the incident light is conducted by means of the mirror reflection to the front face of semiconductor body 30. For this purpose, the inside of the funnel can be covered with a reflective metallic layer. A circumferential groove 70 is formed on the underside of optical element 40. Front face 32 of semiconductor body 30 in the area of the funnel opening is not covered by optical element 40 or by potting compound 50. In contrast, front face 32 of semiconductor body 30 in the edge region is covered by groove 70. Preferably, a sealing layer 80 is formed between the part of groove 70, said part lying on front face 32, and semiconductor body 30. The remaining edge of groove 70 is filled with potting compound 50.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell receiver comprising:
a semiconductor body, having a front face with a solar cell formed on the front face, a rear face, multiple lateral surfaces, and two electrical connectors;
a substrate for receiving the semiconductor body, whereby the rear face of the semiconductor body is fixed to a planar surface of the substrate;
a bypass diode disposed on the planar surface of the substrate in a same plane as the semiconductor body and spaced apart from the semiconductor body, the bypass diode being electrically connected to the semiconductor body;
an optical element for concentrating light on the front face of the semiconductor body, the optical element having an underside, the underside partially faces an upper side of the semiconductor body and the bypass diode; and
an adhesive layer disposed only between the optical element and the substrate,
wherein the optical element on the underside has a first shaped section with a first surface, the first surface being adjacent to the front face of the semiconductor body,
wherein the underside of the optical element has a second surface, the second surface contacting the adhesive layer and the first shaped section forming a groove in the optical element, wherein the optical element is configured as a single piece and is arranged along with the semiconductor body on the planar surface of the substrate, wherein the groove is larger than the semiconductor body and a space between the groove of the optical element and the multiple lateral surfaces of the semiconductor body and the planar surface of the substrate is filled with a potting compound, wherein the bypass diode, the semiconductor body, and the optical element are intersected by a single horizontal plane, wherein the groove of the first shaped section is formed completely circumferential around the multiple lateral surfaces of the semiconductor body, wherein the optical element is a secondary optical element and concentrates further a focused light beam from a primary optical element, and wherein the optical element is made of quartz glass.

2. The solar cell receiver according to claim 1, wherein the bypass diode is arranged on the planar surface of the substrate in the groove.

3. The solar cell receiver according to claim 1, wherein a sealing agent is provided between the multiple lateral surfaces and the first shaped section.

4. The solar cell receiver according to claim 1, wherein the potting compound is formed between the first surface and the front face of the semiconductor body.

5. The solar cell receiver according to claim 1, wherein the optical element has a second shaped section formed as a second groove, the second shaped section enclosing the bypass diode, and the first shaped section enclosing the semiconductor body.

6. The solar cell receiver according to claim 1, wherein a second shaped section of the optical element has a connection with the first shaped section in such a way that only a single shaped section is formed under the optical element.

7. The solar cell receiver according to claim 1, wherein the optical element is formed lens-shaped.

8. The solar cell receiver according to claim 1, wherein the optical element is formed funnel-shaped.

9. The solar cell receiver according to claim 1, wherein the optical element is formed pyramidal/frustum-shaped.

10. The solar cell receiver according to claim 1, wherein the potting compound is transparent.

11. The solar cell receiver according to claim 1, wherein the optical element is transparent to ultraviolet light.

12. A solar cell receiver, comprising:
a substrate including an upper planar surface;
a semiconductor body disposed on the upper planar surface of the substrate and including a top face, a bottom face and at least one electrical connector;
a bypass diode disposed on the upper planar surface of the substrate in a same plane as the semiconductor body, and spaced apart from the semiconductor body, the bypass diode being electrically connected to the semiconductor body; and
an optical element disposed on the upper planar surface of the substrate, over the bypass diode, and over the top face of the semiconductor body, the optical element concentrating light onto the top face of the semiconductor body, the optical element including an upper light-receiving surface and a lower surface, the optical element being formed monolithically between the upper light-receiving surface and the lower surface, wherein the lower surface includes a groove that forms a cavity around the top face and a plurality of lateral sides of the semiconductor body, wherein a peripheral portion of the lower surface of the optical element is flush with the upper planar surface of the substrate, the peripheral portion of the lower surface being offset vertically from an inner surface of the optical element facing the substrate, within the groove, the inner surface being parallel to the peripheral portion of the lower surface, and the peripheral portion of the lower surface is flush with the upper planar surface of the substrate, wherein the bypass diode, the semiconductor body, and the optical element are intersected by a single horizontal plane, wherein the cavity is filled with a potting compound, wherein the groove of the lower surface is formed completely circumferential around and facing the plurality of lateral sides of the semiconductor body, wherein the optical element is a secondary optical element and concentrates further a focused light beam from a primary optical element, and wherein the optical element is made of quartz glass.

* * * * *